United States Patent
Kilcoyne et al.

(10) Patent No.: US 10,504,777 B2
(45) Date of Patent: Dec. 10, 2019

(54) METHOD OF MANUFACTURING WAFER LEVEL LOW MELTING TEMPERATURE INTERCONNECTIONS

(71) Applicant: Raytheon Company, Waltham, MA (US)

(72) Inventors: Sean P. Kilcoyne, Waltham, MA (US); Eric R. Miller, Waltham, MA (US); George Grama, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/895,512

(22) Filed: Feb. 13, 2018

(65) Prior Publication Data

US 2019/0252244 A1    Aug. 15, 2019

(51) Int. Cl.
| | |
|---|---|
| *H01L 21/768* | (2006.01) |
| *H01L 21/56* | (2006.01) |
| *H05K 3/42* | (2006.01) |
| *C23C 18/16* | (2006.01) |
| *H01L 23/31* | (2006.01) |
| *H01L 23/528* | (2006.01) |
| *C25D 7/12* | (2006.01) |

(52) U.S. Cl.
CPC ........ *H01L 21/7684* (2013.01); *C23C 18/168* (2013.01); *C23C 18/1653* (2013.01); *C25D 7/123* (2013.01); *H01L 21/568* (2013.01); *H01L 21/76873* (2013.01); *H01L 23/3121* (2013.01); *H01L 23/5283* (2013.01); *H05K 3/424* (2013.01); *H01L 2221/1089* (2013.01)

(58) Field of Classification Search
CPC ............... H01L 21/7684; H01L 21/568; H01L 23/5283; H01L 23/3121; H01L 21/76873; H01L 2221/1089; C23C 18/1653; C23C 18/168; H05K 3/424; C25D 7/123
See application file for complete search history.

(56) References Cited

U.S. PATENT DOCUMENTS

| | | | |
|---|---|---|---|
| 2002/0004288 A1 | 1/2002 | Nishiyama | |
| 2006/0292851 A1 | 12/2006 | Lin et al. | |
| 2012/0313237 A1 | 12/2012 | Sadaka et al. | |
| 2016/0079034 A1* | 3/2016 | Yieh | H01L 21/26506 427/526 |
| 2017/0271217 A1 | 9/2017 | Kilcoyne et al. | |
| 2017/0287696 A1* | 10/2017 | Noda | C23C 16/455 |
| 2018/0040546 A1* | 2/2018 | Yu | H01L 21/4846 |

(Continued)

OTHER PUBLICATIONS

International Search Report and Written Opinion from related PCT Application No. PCT/US2018/047250 dated Dec. 14, 2018.

(Continued)

*Primary Examiner* — Thanh T Nguyen
(74) *Attorney, Agent, or Firm* — Burns & Levinson, LLP; Joseph M. Maraia

(57) ABSTRACT

A method of manufacturing an array of planar wafer level metal posts includes plating an array of posts within a photoresist (PR) pattern mold on a substrate of a first wafer. Stripping the PR pattern mold from the substrate and array of posts. Applying an oxide layer, at a temperature of below 150 degrees Celsius, over a surface of the first wafer. Applying chemical-mechanical polishing (CMP) to planarize the oxide layer and the array of posts.

17 Claims, 6 Drawing Sheets

(56) References Cited

U.S. PATENT DOCUMENTS

2018/0151389 A1* 5/2018 Kuo .................. H01L 21/486

OTHER PUBLICATIONS

Chen et al., "Wafer-scale 3D integration of InGaAs photodiode arrays with Si readout circuits by oxide bonding and through-oxide vias," Microelectronic Engineering, Elsevier Publishers BV., Amsterdam, NL, vol. 88, No. 1, Jan. 1, 2011, pp. 131-134.

* cited by examiner

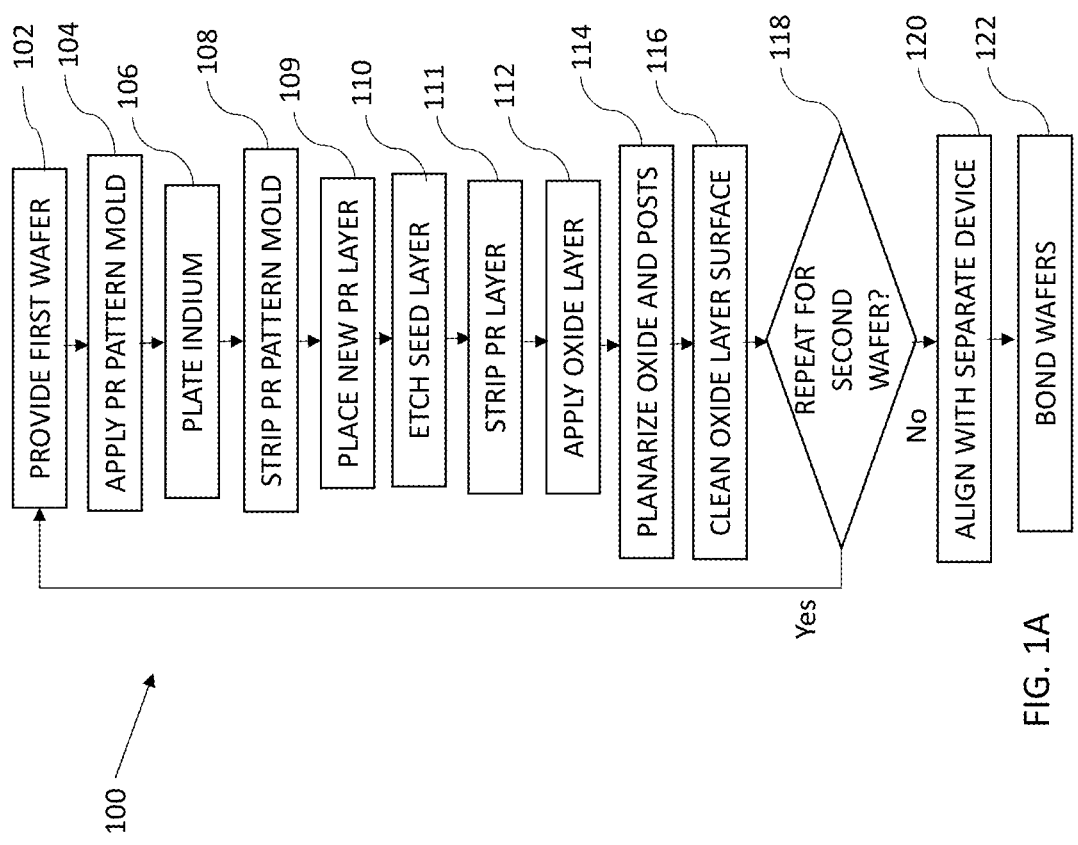

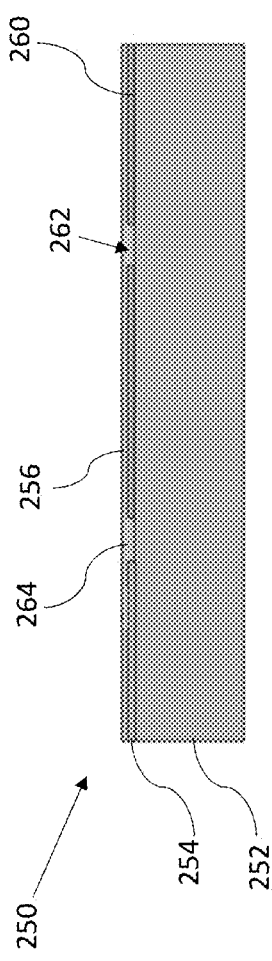
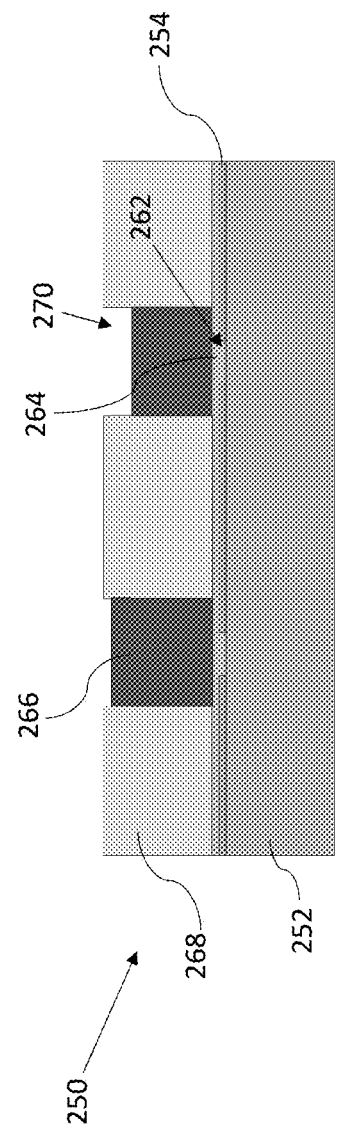

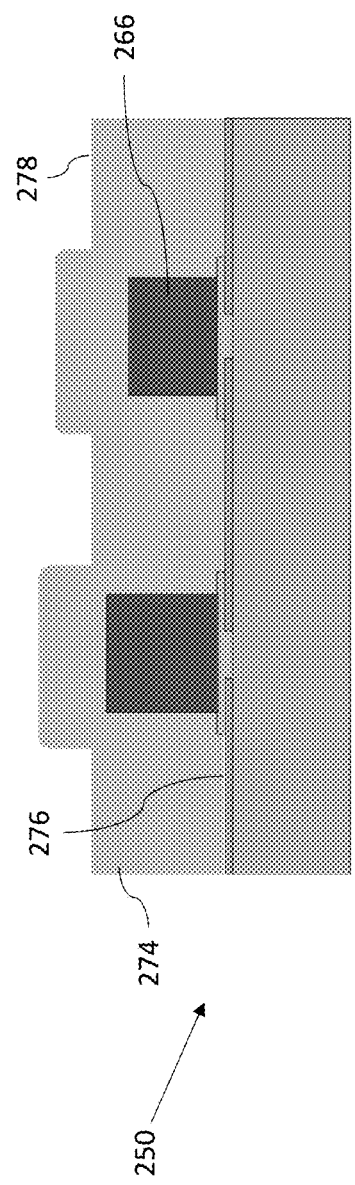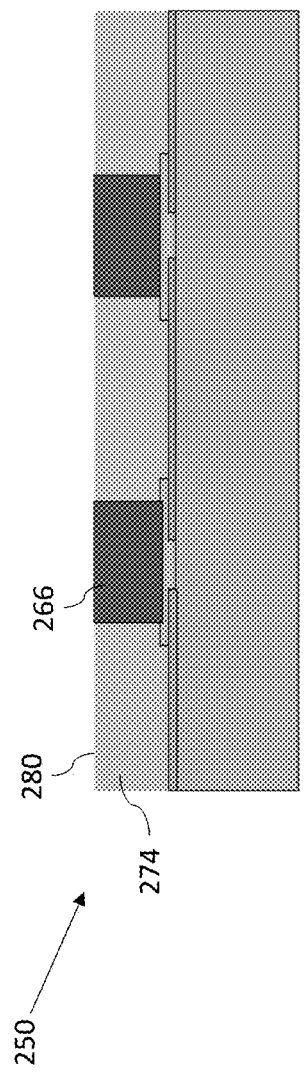

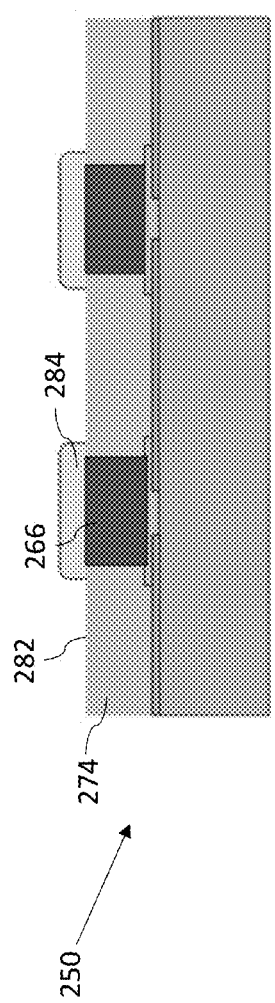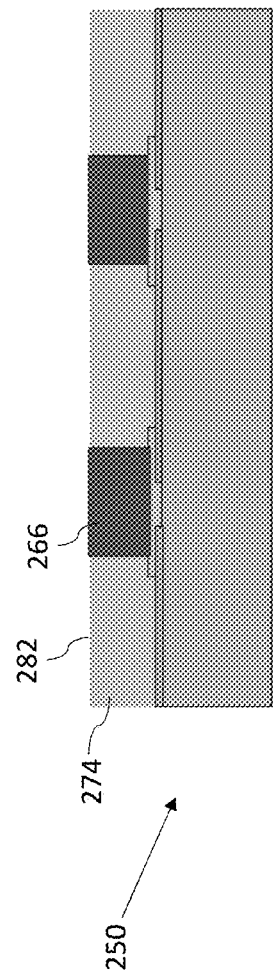

METHOD OF MANUFACTURING WAFER LEVEL LOW MELTING TEMPERATURE INTERCONNECTIONS

FIELD OF THE INVENTION

The subject disclosure relates to the fabrication of semiconductor devices and more particularly to creating wafer interconnections.

BACKGROUND OF THE INVENTION

Various manufacturing methods are employed for creating wafer interconnections. Typical wafer bonding processes involve connecting wafers using direct bond hybridization (DBH or Direct Bond Interconnection). This involves first forming posts on two wafers by electroplating on a metal seed layer through a plating mold of patterned photoresist (PR). A layer of SiO2 is then deposited over the metal structure. The surfaces are then planarized (i.e. made planar), for example, by using a chemical-mechanical polishing (CMP) process. The planar surfaces of the wafers are then aligned and bonded together and annealed.

Certain metals with low melting points, such as Indium, have desirable attributes when used as interconnections, particularly in processes requiring a compliant interconnection metal and as a non-magnetic metal. However, typical DBH interconnection manufacturing processes tend to exceed a temperature of 225 degrees Celsius. Processes at such high temperatures tend to cause low melting point metals, such as Indium which has a melting point of roughly 157 degrees Celsius, to melt and/or deform prior to interconnection. Additionally, applying CMP on a surface which includes certain low melting point interconnections can contaminate the oxide bonding surface, rendering the surface incapable of the bond strength needed for DBH.

Additionally, typical plating techniques have uniformity challenges when filling in fine pitch arrays during the process of developing interconnections. Non-uniformity in the fine pitch arrays can lead to poor interconnectivity.

SUMMARY OF THE INVENTION

In light of the needs described above, in at least one aspect, there is a need for a process which allows for an effective method of manufacturing interconnections for DBH of wafers which can be practiced with low melting point materials while still delivering high yield fine pitch arrays for interconnections.

In at least one aspect, the subject technology relates to a method of manufacturing an array of planar wafer level metal posts. An array of posts are plated within a photoresist (PR) pattern mold on a substrate of a first wafer. The PR pattern mold is stripped from the substrate and array of posts. An oxide layer, at a temperature of below 150 degrees Celsius, is applied over a surface of the first wafer. Chemical-mechanical polishing (CMP) is applied to planarize the oxide layer and the array of posts.

In some embodiments, after the step of stripping the pattern mold, a PR layer is applied around each of the posts. After the step of applying a PR layer, a metal seed layer can be etched on the substrate to singulate the array of posts. After the step of etching the metal seed layer the PR layer can be stripped.

In some embodiments, after the step of applying CMP, the exposed surfaces of the array of posts with a second PR layer are protected. The surface of the oxide layer can then be cleaned, for example, by applying HCL. In some embodiments, during the step of applying an oxide layer, the oxide layer is applied at a temperature of between 127 degrees Celsius and 147 degrees Celsius. In some cases, the oxide layer is applied at a temperature of between 135 degrees Celsius and 139 degrees Celsius. In some cases, the posts are comprised of Indium.

In at least one aspect, the subject technology relates to a method of manufacturing a bonded wafer assembly with Indium interconnections. A first wafer is provided with a substrate layer, an insulating layer, and a metal seed layer, the metal seed layer is connected to the substrate layer by vias extending through a first plurality of holes in the insulating layer. A photoresist (PR) pattern mold is applied over the metal seed layer such that a second plurality of holes through the PR pattern mold align with the vias. Indium is plated within the second plurality of holes in the PR pattern mold to form an array of Indium posts on the first wafer. The PR pattern mold is stripped. A portion of the metal seed layer is etched to singulate the array of Indium posts. An oxide layer is applied at a temperature below 150 degrees Celsius over the surface of the first wafer. Chemical-mechanical polishing (CMP) is applied to form a planar surface, the planar surface including the array of Indium posts and the oxide layer. The aforementioned steps are repeated to create a second wafer. The Indium posts of the first and second wafers are then aligned. The first wafer and the second wafer are then bonded together to form the bonded wafer assembly.

In some embodiments, the bonding is done through a low temperature annealing process. In some embodiments, placing a PR layer around each of the Indium posts. In some embodiments, after etching the metal seed layer and before applying the oxide layer the PR layer is stripped. In some embodiments, after applying CMP, a second PR layer is placed over exposed surfaces of the array of Indium posts. In some cases, after the step of placing a second PR layer an exposed surface of the oxide layer is cleaned. Cleaning an exposed surface of the oxide layer can be done by applying HCl. In some embodiments, the oxide layer is applied at a temperature of between 127 degrees Celsius and 147 degrees Celsius. In some embodiments, the oxide layer is applied at a temperature of between 135 degrees Celsius and 139 degrees Celsius.

BRIEF DESCRIPTION OF THE DRAWINGS

So that those having ordinary skill in the art to which the disclosed system pertains will more readily understand how to make and use the same, reference may be had to the following drawings.

FIG. 1A is a flowchart illustrating a method for manufacturing a wafer assembly in accordance with the subject technology.

FIG. 1B is a flowchart illustrating a simplified method for manufacturing wafer level interconnections in accordance with the subject technology.

FIG. 2 is a schematically illustrated cross sectional view of a wafer during a method of manufacturing wafer level interconnections in accordance with the subject technology.

FIG. 3 is a schematically illustrated cross sectional view of a wafer during a method of manufacturing wafer level interconnections in accordance with the subject technology.

FIG. 6 is a schematically illustrated cross sectional view of a wafer during a method of manufacturing wafer level interconnections in accordance with the subject technology.

FIG. 7 is a schematically illustrated cross sectional view of a wafer during a method of manufacturing wafer level interconnections in accordance with the subject technology.

FIG. 8 is a schematically illustrated cross sectional view of a wafer during a method of manufacturing wafer level interconnections in accordance with the subject technology.

FIG. 9 is a schematically illustrated cross sectional view of a wafer during a method of manufacturing wafer level interconnections in accordance with the subject technology.

DETAILED DESCRIPTION

Figure 4:
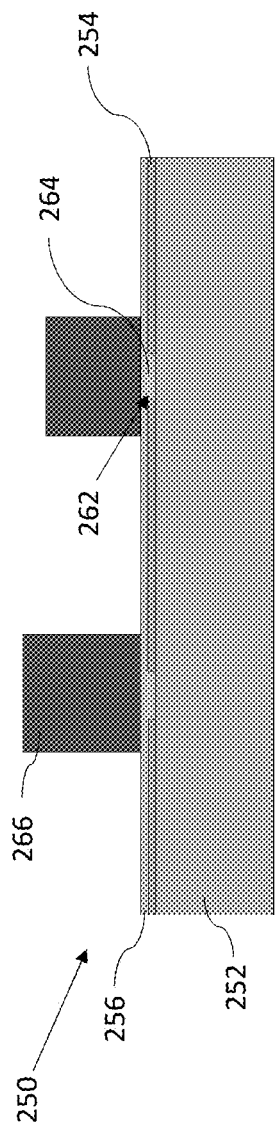
FIG. 4 is a schematically illustrated cross sectional view of a wafer during a method of manufacturing wafer level interconnections in accordance with the subject technology.

The subject technology overcomes many of the prior art problems associated with the fabrication of semiconductor devices. In brief summary, the subject technology provides a method of manufacturing a wafer or wafer assembly, particularly one that can include Indium based interconnections. The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words denoting orientation such as "upper", "lower", "distal", and "proximate" are merely used to help describe the location of components with respect to one another in the figures. For example, an "upper" surface of a part is merely meant to describe a surface that is separate from the "lower" surface of that same part, as shown in the figures. No words denoting orientation are used to describe an absolute orientation (i.e. where an "upper" part must always be on top).

Referring now to FIG. 1A a flowchart illustrating a method 100 for manufacturing wafer level interconnections in accordance with the subject technology is shown. The method 100 generally involves creating interconnections on a wafer device such as a III-V semiconductor device and optionally bonding with a separate wafer to form a wafer assembly. In the example shown, the method 100 starts at first step 102 which includes providing a first wafer 250 with a device layer 252, an insulating layer 254, and a metal seed layer 256, as seen in FIG. 2. Preliminary steps of manufacturing the first wafer 250 are understood in the art and therefore a thorough description thereof is omitted. The device layer 252 is typically a Silicon substrate and includes processing circuitry extending therethrough comprised of Al, Cu, implantation or the like. The insulating layer 254 is positioned over the upper surface 260 of the device layer 252 and can be comprised of materials such as $SiO_2$, $SiN_x$, or the like. The metal seed layer 256 is provided for plating posts or interconnections, as is discussed more fully below, and is comprised of materials such as TiW, Al, Sn, or the like. The insulating layer 254 is broken by a first plurality of holes or perforations 262 through which the metal seed layer 256 extends, forming vias 264. The vias 264 are used to provide a connection between the device layer 252 and the posts or interconnections discussed below. Notably, both the insulating layer 254 and the metal seed layer 256 may additionally or alternatively be comprised of other materials known in the art to function in accordance with the insulating layer 254 and metal seed layer 256 described herein.

At step 104, and referring now additionally to FIG. 3, in order to create the interconnections, or posts 266, a photoresist (PR) pattern mold 268 is applied over the metal seed layer 256. The PR pattern mold 268 is patterned with a second plurality of holes or perforations 270 which correspond to the perforations 262 in the insulating layer 254. At step 106, the Indium is plated within the PR pattern mold 268 to form an array of posts 266. The PR pattern mold 268 allows for improved Indium plating uniformity and reduces Indium contamination from bonding oxide, as the Indium is not dragged across oxide. The posts 266 are formed as a small dense array that grows from the metal seed layer 256 when current is provided and will eventually serve as high yield fine pitch array for interconnections for the first wafer 250. The posts 266 are grown within the perforations 270 which align with the vias 264, such that the vias 264 connect the posts 266 to the device layer 252. Thus, the posts 266 eventually form the interconnections on the first wafer 250. While Indium has been found to be effectively used to form the posts 266 within the disclosed method 100, it should be noted that the methods discussed herein are applicable to other elements and/or materials which can be used in the formation of wafer interconnections. In particular, the method 100 and other methods discussed herein have been found to be effective when the posts 266 which form the interconnections are comprised materials/elements with a low melting point, such as below 200 degrees Celsius. This is because the method 100 is designed to avoid melting material with a low melting point, whereas other process of forming interconnections and bonding wafers will often melt and/or deform such material.

Figure 5:
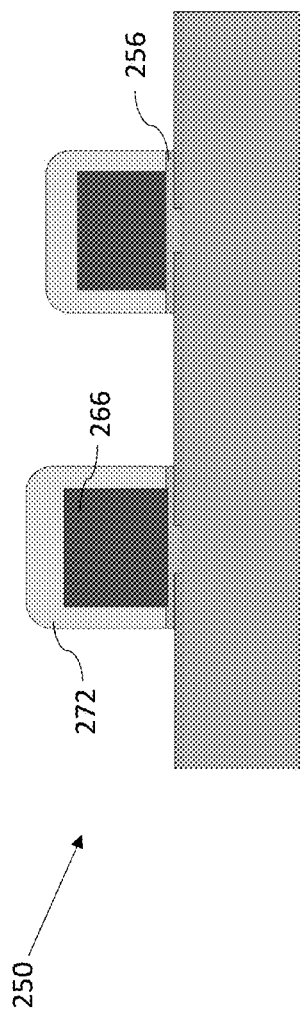
FIG. 5 is a schematically illustrated cross sectional view of a wafer during a method of manufacturing wafer level interconnections in accordance with the subject technology.

At step 108, the PR pattern mold 268 is stripped as seen in FIG. 4. Then, turning to FIG. 5, a second PR layer 272 can optionally be placed surrounding the posts 266 at step 109. At step 110, the metal seed layer 256 is then etched to singulate the posts 266 such that the posts 266 are isolated from one another (i.e. not directly connected through the metal seed layer 256). Etching can be accomplished, for example, by photolithographic techniques as are known in the art. The second PR layer 272 protects the posts 266 during the metal etching process and can be stripped, at step 111, after the etching process is complete.

At step 112 a low temperature oxide is applied over a surface 276 of the first wafer 250 (and around the posts 266 extending from the surface 276) as seen in FIG. 6, to form an oxide layer 274. In one example, where the posts 266 are comprised of Indium, the low temperature oxide is below the melting temperature of Indium, which is about 157 degrees Celsius. Therefore in at least some embodiments, the temperature of the low temperature oxide is applied at a temperature of below 150 degrees Celsius. In some embodiments, the low temperature oxide is applied at a temperature of substantially 20 degrees Celsius below the melting point of Indium, such as between 127 degrees Celsius and 147 degrees Celsius. In other embodiments, the temperature of the low temperature oxide is between 135 degrees Celsius and 139 degrees Celsius. If a material other than Indium is used for the posts 266, corresponding oxide temperature ranges can be applied (e.g. substantially 20 degrees below a melting point of the other material). Alternatively, if the posts 266 are formed of a material with a higher melting point than Indium, the oxide can be applied within one of the temperature ranges described above. By applying the oxide at a temperature that is below (or well below) the melting point of the posts 266, there is less of a risk that the posts 266 will be deformed during formation of the oxide layer 274. In this way, the integrity of the wafer 250 is maintained.

After the oxide layer 274 is formed, a new surface 278 of the first wafer 250 is formed which is typically non-uniform. Therefore at step 114, and as seen in FIG. 7, chemical-mechanical polishing (CMP) is then applied to the non-uniform surface 278. Applying CMP to the non-uniform surface 278 of the first wafer 250 removes excess post 266 and oxide layer 274 material to smooth and/or level the surface 278. CMP is applied until the oxide layer 274 and posts 266 have been planarized, forming a flat and continuous upper surface 280 of the wafer 250. A planarized surface 280 helps bond the first wafer 250 to a second wafer, as discussed below.

Next, at step 116, the surface 282 of the oxide layer 274 is optionally cleaned without also cleaning the surface of the posts 266. FIG. 8 shows an optional intermediate step of placing a second PR layer 284 over the posts 266 to serve as a protective cap for the posts 266 during cleaning. Cleaning typically involves applying a substance, such as an acid, to the surface 282 of the oxide layer 274. For example, HCl can be applied over to the surface 282 of the oxide layer 274. Cleaning the surface 282 removes contamination created by the formation of the posts 266 (e.g. Indium contamination on the oxide layer 274) and helps prepare the first wafer 250 for effective bonding with another wafer. After cleaning is complete, the second PR layer 284 can be stripped from the posts 266 at FIG. 9 using any means known in the art. The first wafer 250 is now ready for bonding to another wafer.

Figure 10:
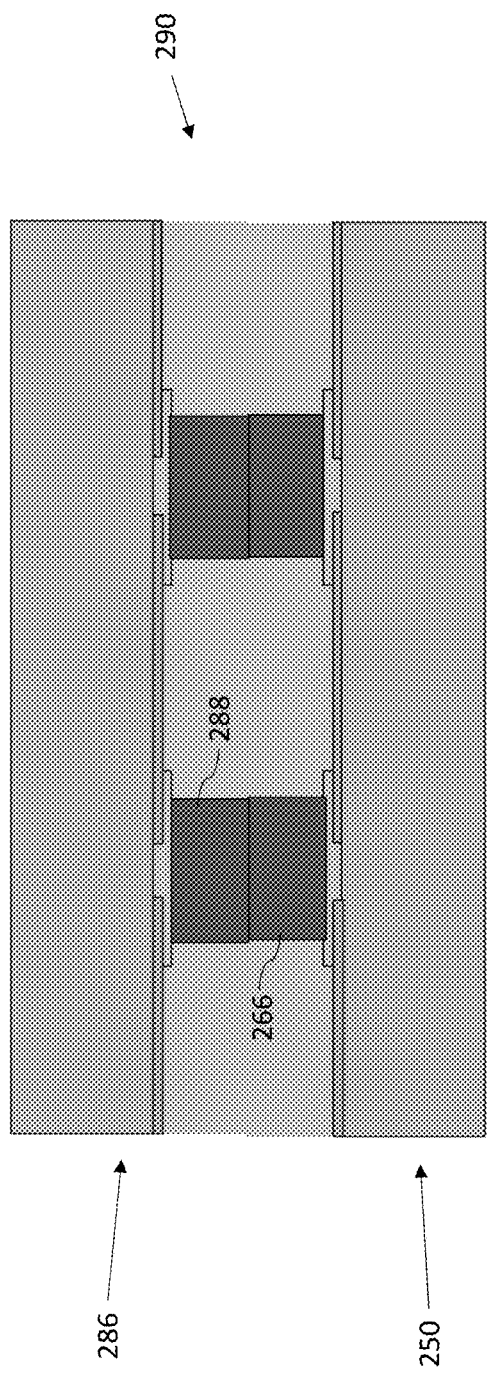
FIG. 10 is a schematically illustrated cross sectional view of a bonded wafer assembly created by a method in accordance with the subject technology.

Referring now to FIG. 10, the first wafer 250 can be bonded to a second wafer 286 which is similar, or identical, to the first wafer 250 to form a wafer assembly 290. For example, at step 118, the steps described above (i.e. 102-116) can be performed a second time to form the second wafer 286 and prepare it for bonding. To that end, the second wafer 286 can likewise include posts 288 comprised of Indium (or other low temperature material for forming interconnections) at a similar position within the second wafer 286 as the posts 266 within the first wafer 250. Forming posts 288 at a similar position within the second wafer 286 allows for good alignment of the posts 266, 288 of the first and second wafers 250, 286. For example, FIG. 10 shows the first wafer 250 and the second wafer 286 with similarly positioned posts 266, 288. At step 120, the posts 266 of the first wafer 250 are then aligned with posts 288 of the second wafer 286 using a separate device (not shown in the figures). The wafers 250, 286 are then bonded at step 122 to form the wafer assembly 290. The bonding can be accomplished, for example, by a low temperature annealing process. Once bonded, the posts 266, 288 provide interconnections between the wafers 250, 286.

Notably, and as mentioned above, not all steps of the method of manufacturing shown in FIG. 1A are absolutely necessary. While various steps shown in FIG. 1A may provide different benefits, the method shown in FIG. 1A can be simplified, if desired, by manufacturing a wafer with only some of the steps shown in FIG. 1A. To that end, a simplified method 130 of manufacturing a wafer in accordance with the subject technology is shown in FIG. 1B.

Referring now to FIG. 1B, the method 130 starts with plating an array of posts, such as posts 266, on a substrate of first wafer 250, such as is shown in FIG. 3. As described with respect to method 100, the posts 266 can be grown off the metal seed layer 256 of a substrate comprised of a metal seed layer 256, an insulating layer 254, and a device layer 252. Further, the posts 266 can be grown within a PR pattern mold 268. Alternatively, the post metal can be deposited using physical vapor deposition, Chemical vapor deposition, or the like.

At step 134, after the posts 266 have formed, the PR pattern mold 268 can be stripped from the first wafer 250 as seen in FIG. 4. A low temperature oxide is then applied over the surface of the first wafer 250, a step 136, to form an oxide layer 274 as seen in FIG. 6. As discussed above, the low temperature oxide can be applied at a temperature of substantially 20 degrees Celsius below the melting point of the posts 266. For example, if the posts 266 are Indium (which has a melting point of roughly 157 degrees Celsius), the low temperature can be applied between 127 degrees Celsius and 147 degrees Celsius, between 135 degrees Celsius and 139 degrees Celsius, or simply below 150 degrees Celsius. The low temperature oxide can be applied at a similar range below the melting temperature of other materials used to form the posts 266, or alternatively, the aforementioned temperature ranges can be applied regardless of the material used. Finally, at step 138, CMP is applied to the surface of the first wafer 250 to planarize a surface 280 formed by the posts 266 and oxide layer 274, as seen in FIG. 7. The first wafer 250 can then be optionally cleaned, as discussed with respect to step 116, and then bonded to a second wafer 286 to form a wafer assembly 290, as discussed in steps 120-122 and as shown in FIG. 10. Notably, in different embodiments, any of the steps or combinations of steps disclosed in FIG. 1A with respect to method 100 and/or shown in the figures herein, can be combined with the steps disclosed in FIG. 1B with respect to method 130 to provide additional benefits if desired.

It will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements (e.g. molds and the like) shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may depend from any or all claims in a multiple dependent manner even though such has not been originally claimed. Additionally, in various embodiments the methods shown can be carried out with any combination of the steps shown, or with any combination of a portion of the steps shown.

What is claimed is:

1. A method of manufacturing an array of planar wafer level metal posts comprising:
   plating an array of posts within a photoresist (PR) pattern mold on a substrate of a first wafer;
   stripping the PR pattern mold from the substrate and array of posts;
   after the step of stripping the PR pattern mold, applying a PR layer around each of the posts;
   after the step of applying a PR layer, etching a metal seed layer on the substrate to singulate the array of posts;

applying an oxide layer, at a temperature of below 150 degrees Celsius, over a surface of the first wafer and around the array of posts extending from the surface; and applying chemical-mechanical polishing (CMP) to planarize the oxide layer and the array of posts.

2. The method of claim 1 further comprising, after the step of etching a metal seed layer, stripping the PR layer.

3. The method of claim 1 wherein in the step of applying an oxide layer, the oxide layer is applied at a temperature of between 127 degrees Celsius and 147 degrees Celsius.

4. The method of claim 1 wherein in the step of applying an oxide layer, the oxide layer is applied at a temperature of between 135 degrees Celsius and 139 degrees Celsius.

5. The method of claim 1 wherein the posts are comprised of Indium.

6. A method of manufacturing a bonded wafer assembly with Indium interconnections comprising:
 a) providing a first wafer with a substrate layer, an insulating layer, and a metal seed layer, the metal seed layer connected to the substrate layer by vias extending through a first plurality of holes in the insulating layer;
 b) applying a photoresist (PR) pattern mold over the metal seed layer such that a second plurality of holes through the PR pattern mold align with the vias;
 c) plating Indium within the second plurality of holes in the PR pattern mold to form an array of Indium posts on the first wafer;
 d) stripping the PR pattern mold;
 e) etching a portion of the metal seed layer to singulate the array of Indium posts;
 f) applying an oxide layer, at a temperature below 150 degrees Celsius, over a surface of the first wafer;
 g) applying chemical-mechanical polishing (CMP) to form a planar surface, the planar surface including the array of Indium posts and the oxide layer;
 h) performing steps a)-g) to create a second wafer;
 i) aligning the Indium posts of the first and second wafers; and
 j) bonding the first wafer and the second wafer together to form the bonded wafer assembly.

7. The method of claim 6 wherein in step (j), the bonding is done through a low temperature annealing process.

8. The method of claim 6 further comprising, after step (d) and before step (e), placing a PR layer around each of the Indium posts.

9. The method of claim 8 further comprising, after step (e) and before step (f), stripping the PR layer.

10. The method of claim 8 further comprising, after step (g), placing a second PR layer over exposed surfaces of the array of Indium posts.

11. The method of claim 10 further comprising, after the step of placing a second PR layer, cleaning an exposed surface of the oxide layer.

12. The method of claim 11 wherein cleaning an exposed surface of the oxide layer is done by applying HCl.

13. The method of claim 6 wherein in the step (f), the oxide layer is applied at a temperature of between 127 degrees Celsius and 147 degrees Celsius.

14. The method of claim 6 wherein in the step (f), the oxide layer is applied at a temperature of between 135 degrees Celsius and 139 degrees Celsius.

15. A method of manufacturing an array of planar wafer level metal posts comprising:
 plating an array of posts within a photoresist (PR) pattern mold on a substrate of a first wafer;
 stripping the PR pattern mold from the substrate and array of posts;
 after the step of stripping the PR pattern mold, applying a PR layer around each of the posts;
 applying an oxide layer, at a temperature of below 150 degrees Celsius, over a surface of the first wafer and around the array of posts extending from the surface;
 applying chemical-mechanical polishing (CMP) to planarize the oxide layer and the array of posts; and
 after the step of applying CMP, protecting exposed surfaces of the array of posts with a second PR layer.

16. The method of claim 15 further comprising, after the step of protecting exposed surfaces of the array of posts, cleaning a surface of the oxide layer.

17. The method of claim 16 wherein in the step of cleaning a surface of the oxide layer, the surface is cleaned by applying HCl.

* * * * *